United States Patent [19]

Ugurbil et al.

[11] Patent Number: 4,988,947
[45] Date of Patent: * Jan. 29, 1991

[54] AMPLITUDE AND FREQUENCY/PHASE MODULATED PULSES TO ACHIEVE PLANE ROTATIONS OF NUCLEAR SPIN MAGNETIZATION VECTORS WITH INHOMOGENEOUS $B_1$ FIELDS

[75] Inventors: Kamil Ugurbil, Maple Plaine; Michael Garwood, Minneapolis, both of Minn.

[73] Assignee: Regents of the University of Minnesota, Minneapolis, Minn.

[*] Notice: The portion of the term of this patent subsequent to Apr. 3, 2007 has been disclaimed.

[21] Appl. No.: 406,758

[22] Filed: Sep. 13, 1989

Related U.S. Application Data

[63] Continuation of Ser. No. 32,059, Mar. 27, 1987, Pat. No. 4,914,392.

[51] Int. Cl.⁵ ............................................. G01R 33/20
[52] U.S. Cl. ..................................................... 324/307
[58] Field of Search ............... 324/300, 303, 307, 309, 324/310, 311, 312, 313, 314, 318, 322; 128/653

[56] References Cited

U.S. PATENT DOCUMENTS

| | | | |
|---|---|---|---|
| 3,723,856 | 3/1973 | Brown | 324/303 |
| 4,390,840 | 6/1983 | Ganssen et al. | 324/309 |
| 4,480,228 | 10/1984 | Bottomley | 324/309 |
| 4,486,709 | 12/1984 | Bendall | 324/314 |
| 4,528,508 | 7/1985 | Vail, III | 324/303 |
| 4,535,290 | 8/1985 | Post et al. | 324/309 |
| 4,551,680 | 11/1985 | Mackovski | 324/309 |
| 4,613,949 | 9/9198 | Glover et al. | 324/307 |
| 4,695,799 | 9/1987 | Hardy et al. | 324/309 |
| 4,774,466 | 9/1988 | Sattin | 324/309 |
| 4,820,983 | 4/1989 | Bendall | 324/307 |
| 4,868,501 | 9/1989 | Conolly | 324/309 |

FOREIGN PATENT DOCUMENTS

| | | |
|---|---|---|
| 0129356 | 12/1984 | European Pat. Off. |
| 0166559 | 1/1986 | European Pat. Off. |
| 0170508 | 2/1986 | European Pat. Off. |
| 0206129 | 12/1986 | European Pat. Off. |
| 0229228 | 7/1987 | European Pat. Off. |
| 7403782 | 8/1975 | France |
| 8703370 | 6/1987 | PCT Int'l Appl. |
| 392937 | 10/1965 | Switzerland |
| 2139764 | 11/1984 | United Kingdom |

OTHER PUBLICATIONS

"Spatial Localization of Tissue Metabolites by Phosphorus-31 NMR Rotating Frame Zeugmatography", M. Garwood, et al., *Journal of Magnetic Resonance, vol. 60, pp. 268-279 (1984).*

"A Modified Rotating Frame Experiment Based on a Fourier Series Window Function. Application to in Vivo Spatially Localized NMR Spectroscopy", M. Garwood, et al., *Journal of Magnetic Resonance, vol. 65, pp. 239-251 (1985).*

"Use of Amplitude/Phase/Frequency Modulated Pulses with Highly Inhomogeneous $B_1$ Fields to Conduct Phase-Modulated Rotating Frame Experiments",

(List continued on next page.)

*Primary Examiner*—Michael J. Tokar
*Attorney, Agent, or Firm*—Merchant, Gould, Smith, Edell, Welter & Schmidt

[57] ABSTRACT

Two amplitude/frequency/phase modulated pulses that can achieve 90° plane rotations over large $B_1$ field inhomogeneities are described. The pulses achieve this by use of a "flip" in the direction of the effective $B_1$ field half-way through the pulse, and by use of a discontinuous phase jump in addition to continuous frequency of phase modulation. These pulse can be used for rotation of magnetization vectors between any plane that is perpendicular to the transverse plane and the transverse plane of the rotating reference frame. Consequently, then can be used for interchanging amplitude and phase information and converting amplitude modulated rotating frame experiments into phase modulated experiments.

20 Claims, 7 Drawing Sheets

OTHER PUBLICATIONS

K. Ugurbil, et al., Society of Magnetic Resonance in Medicine, 1986 Abstract for Scientific Papers and Posters, Works in Progess #098, Aug. 18, 1986.

"Improved Fourier Series Windows for Localization in Vivo NMR Spectroscopy", M. Garwood, et al., *Journal of Magnetic Resonance*, vol. 65, pp. 510–515 (1985).

"Amplitude and Frequency Modulated Pulses to Achieve 90° Plane Rotations with Inhomogeneous $B_1$ Fields", K. Ugurbil, et al., *Journal of Magnetic Resonance*, vol. 72, pp. 177–185 (Mar. 1987).

"Communications: Adiabatic Refocusing Pulse Which Compensates for Variable Power and Off–Resonance Effects", M. Bendall, et al., *Magnetic Resonance in Medicine*, vol. 4, pp. 493–499 (May 1987).

"Rotating Frame Zeugmatography", D. I. Hoult, *Journal of Magnetic Resonance*, vol. 33, pp. 183–197 (1979).

"Principals of Magnetic Resonance", C. P. Slichter, 2nd Ed., p. 24, Springer-Verlag, Berlin/New York, 1979.

"Mapping of Metabolites in Whole Animals by $^{31}P$ NMR Using Surface Coils", Joseph J. H. Ackerman et al., Nature, vol. 283, pp. 167–170 (Jan. 10, 1980).

"Communications: Toward Biochemical Imaging", S. J. Cox, et al., *Journal of Magnetics Resonance*, vol. 40, pp. 209–212 (1980).

"Broadband Population Inversion by Phase Modulated Pulses", J. Baum, et al., *Journal of Chemical Physics*, vol. 79, p. 4643 (1983).

"Spatial Localization of High Resolution $^{31}P$ Spectra with a Surface Coil", Axel Haase et al., *Journal of Magnetic Resonance*, vol. 55, pp. 164–169 (1983).

"Solvent Suppression in Fourier Transform Nuclear Magnetic Resonance", P. J. Hore, *Journal of Magnetic Resonance*, vol. 55, p. 383 (1983).

"Volume-Selective Excitation, A Novel Approach to Topical NMR", W. P. Aue, et al., *Journal of Magnetic Resonance*, vol. 56, pp. 350–354 (1984).

"Depth-Resolved Surface-Coil Spectroscopy (DRESS) for in Vivo $^1H$, $^{31}P$, and $^{13}C$ NMR", Paul A. Bottomley, et al., *Journal of Magnetic Resonance*, vol. 59, pp. 338–342 (1984).

"Selective Spin Inversion in Nuclear Magnetic Resonance and Coherent Optics Through and Exact Solution of the Blo ch–Riccati Equation", M. S. Silver, et al., *Physical Review*, vol. 31, No. 4 (Apr. 1985).

A Method for Localizing High-Resolution NMR Spectra from Human Subjects, Peter Styles et al., *Magnetic Resonance in Medicine*, vol. 2, pp. 402–409 (1985).

NMR Imaging and Spectroscopic Techniques in Biology and Medicine, Randall Rue, *HPA Bulletin*, pp. 19–27 (Dec. 1985).

Image-Selected in Vivo Spectroscopy (ISIS). A New Technique for Spatially Selective NMR Spectroscopy, R. J. Ordidge et al., Journal of Magnetic Resonance, vol. 66, pp. 283–294 (1986).

"Solvent-Suppressed Spatially Resolved Spectroscopy, An Approach to High-Resolution NMR on a Whole-Body MR System", Peter R. Luyten et al., *Journal of Magnetic Resonance*, vol. 67, pp. 148–155 (1986).

"Uniform Sample Excitation with Surface Coils for in Vivo Spectroscopy by Adiabatic Rapid Half Passage", M. Robin Bendall et al., *Journal of Magnetic Resonance*, vol. 67, pp. 376–381 (1986).

"Improved Selective 180° Radiofrequency Pulses for Magnetization Inversion and Phase Reversal", Hon Yan, et al., *Journal of Magnetic Resonance*, vol. 71, pp. 116–131 (1987).

*Nuclear Magnetic Resonance Imaging in Medicine*, L. Kaufman, et al., p. 105.

"The Influence of Experimental Parameters in Surface-Coil NMR", A. Haase, et al., *Journal of Magnetic Resonance*, vol. 56, pp. 401–412 (1984).

"Elimination of High-Flux Signals near Surface Coils and Field Gradient Sample Localization Using Depth Pulses", M. Bendall, *Journal of Magnetic Resonance*, vol. 59, 406–129 (1984).

"Pulse and Fourier Transform MNR", p. 13, T. C. Farrar and E. D. Becker, Academic Press, New York (1971).

"Theoretical Description of Depth Pulse Sequences, On and Off Resonance, Including Improvements and Extensions Thereof", M. Bendall, et al., *Magnetic Resonance in Medicine*, vol. 2, pp. 91–113 (1985).

"Composite Pulses without Phase Distortion", R. Tycko, et al., *Journal of Magnetic Resonance*, vol. 61, pp. 90–101 (1985).

"Highly Selective n/2 and n Pulse Generation", M. Silver, et al., *Journal of Magnetic Resonance*, vol. 59, pp. 347–351 (1984).

"Comparison of Depth Pulse Sequences with Composite Pulses for Spatial Selection in vivo NMR", M. Bendall, *Journal of Magnetic Resonance*, vol. 63, pp. 494–503 (1985).

"Suppression of Artifacts in Two-Dimensional J. Spectroscopy", G. Bodenhausen, et al., *Journal of Magnetic Resonance*, vol. 27, pp. 511–514 (1977).

FREQUENCY (Hz)

AMPLITUDE AND FREQUENCY/PHASE MODULATED PULSES TO ACHIEVE PLANE ROTATIONS OF NUCLEAR SPIN MAGNETIZATION VECTORS WITH INHOMOGENEOUS $B_1$ FIELDS

This invention was made with Government support under Grant No. HL 33600 awarded by NIH. The Government has certain rights in the invention.

This is a continuation of application Ser. No. 032,059, filed Mar. 27, 1987, and now U.S. Pat. No. 4,914,392.

TECHNICAL FIELD OF THE INVENTION

The present invention pertains generally to the field of magnetic resonance imaging and spectroscopy, and more particularly to RF pulse modulation techniques for use with coils that possess inhomogeneities in the $B_1$ fields they generate.

BACKGROUND OF THE INVENTION

Magnetic resonance imaging (MRI) is rapidly becoming the most important imaging technique in medicine. Despite their considerable expense, hundreds of MRI systems are now in use in medical facilities throughout the world. MRI systems utilize the magnetic properties of the chemical constituents in body tissue in order to obtain an image. Detailed images of both hard and soft tissues can be obtained using MRI. Soft tissues may be imaged without using invasive and sometimes risky contrast agents as often required with X-ray imaging systems. In fact, MRI can obtain images which were heretofore unobtainable using X-ray or other imaging techniques. Moreover, the magnetic and radio frequency fields used in MRI techniques are believed to be considerably safer for the patient than the ionizing radiation required for X-ray techniques. Thus, MRI is an extremely important new imaging technology.

Magnetic resonance techniques may also be used to perform spectroscopy. Such techniques, which analyze tissues by detecting magnetic resonance properties of their constituent chemicals are known as magnetic resonance spectroscopy (MRS). MRS may be used to perform non-invasive in-vivo tissue analysis in place of or as a supplement to the conventional biopsy. MRS can also be used to obtain biochemical information non-invasively from tissues not accessible to biopsy procedures. Thus, MRS is capable of providing information on tissue make-up not obtainable through X-ray or any other imaging technology.

The basic operating theory behind MRI and MRS is set forth in simplified form as follows. First, a constant, uniform magnetic field ($B_0$) must be generated throughout the body area or tissue to be imaged or analyzed. This $B_0$ field aligns the various magnetic moments or "spins" in the body's matter. By applying a transient magnetic field ($B_1$) oriented perpendicularly to the $B_0$ field the spins can be temporarily tilted out of alignment with the $B_0$ field. As they return to their aligned state each different chemical component emits a characteristic energy which is typically in the RF band. This emission can be detected to form the basis for an image or a spectroscopic analysis. Most imaging systems detect the presence of hydrogen due to its prevalence in the body. However, other elements and compounds may be used for the basis of imaging.

Most often permanent supercooled magnets are used to generate the required $B_0$ field. The magnetic field is generated by one or more solenoids made of a superconductive alloy wire which is cooled with liquid helium to a superconducting state. The solenoids are axially aligned and the field is generated in a cylindrical volume of space coextending with the center areas of the solenoids. For in-vivo applications, this area must be large enough to accommodate the body portion to be imaged or analyzed. A typical coil used for in-vivo applications has an inside diameter in the range of one to three feet.

The $B_1$ field is generated using an RF coil. Ideally, the $B_1$ field is uniform strength throughout the volume of matter to be imaged or analyzed. For in-vivo applications "whole body" coils are used for this purpose. While such coils are capable of generating a relatively uniform $B_1$ field throughout a volume of body tissue, they are relatively complex in operation, expensive and undesirably large for many applications. Even these complex coils exhibit $B_1$ inhomogeneities that lead to the appearance of $B_1$ artifacts in MRI or MRS. Pick-up coils are employed to detect the RF band emissions stimulated by the transient $B_1$ field. In applications where a high signal-to-noise ratio is desired, separate pick-up coils of smaller dimension that are placed directly over the region of interest are employed. Typically, relatively simple and inexpensive "surface coils" are used for this purpose. A surface coil is merely a wire loop typically having a diameter in the range of an inch to twelve inches. The pickup coils must be tuned to the same frequency as the whole body RF coil. However, if two coils tuned to the same frequency are within close proximity of each other, unless their $B_1$ fields are completely orthogonal at each point in space, they couple to each other and alter their tuning frequencies. Therefore, when separate coils are used for RF transmission and signal detection, they must be decoupled from the RF coil in order to avoid confusing pulsed RF with the resulting return emissions from the body matter. Although this arrangement is technically feasible, high degrees of decoupling are difficult to attain and add an extra measure of complexity and artifact source to the system.

As compared to whole body coils such as birdcage coils and saddle coils, surface coils are relatively easy to work with and inexpensive. Moreover, because they do not require the relatively large geometries of whole body coils they can be configured to generate RF and detect signals only from the region of interest, eliminating the noise generated by all other regions in the sample. This can be very beneficial when attempting certain types of imaging or spectroscopic analysis. Furthermore, if the same coil can be used to both generate the RF pulses and sense the return emission, the need for decoupling and the corresponding artifact source is greatly reduced. Thus, it has been recognized for some time that it would be highly desirable if surface coils could be used to generate the required RF pulses as well as detect the returning emissions, particularly for localized imaging and spectroscopy. By their very nature, however, surface coils are unable to generate a uniform $B_1$ field through any appreciable or useful volume of space; the magnitude of the $B_1$ field generated by a surface coil is strongly dependent on spatial coordinates. As a consequence, surface coils have not been used for RF transmission in applications that require homogeneous $B_1$ fields such as image construction or localized spectroscopy using tailored pulses in conjunction with pulsed-field gradients.

It is the inability to perform uniform 90 degree and 180 degree rotation of magnetic spins about a well defined axis which is the specific deficiency of surface coils when used for $B_1$ field generation. Provided that such rotations could be performed despite $B_1$ field inhomogeneities, RF coils of many different geometries could be used for both RF generation and signal detection. As previously mentioned, even coils with complex designs (such as the Helmholtz or the birdcage coil) have inhomogeneities in their $B_1$ profiles. Pulses that induce uniform rotations despite such inhomogeneities would improve the performance of these coils and eliminate artifacts that arise because of them.

Others have suggested two frequency and amplitude modulated pulses which can be generated by a surface coil to rotate z-magnetization to the -z axis or the transverse plane of the rotating reference frame. See MS Silver, R. I., Joseph, and D. I. Holt, *J. Magn. Reson* 59, 347 (1984) and Mr. Bendall and D. J. Pegg, *J. Magn. Reson.* 67, 376 (1986). One of the unique features of these pulses is their relative insensitivity to large variations in the Bl field magnitude. However, these pulses cannot execute 90 degree or 180 degree plane rotations with a well defined phase. In other words, they cannot rotate by 90 or 180 degrees all magnetization vectors that are contained in a given plane. Therefore, while they can be employed for signal excitation or inversion, they cannot be used for refocusing (which requires a 180° plane rotation pulse) or rotation of magnetization vectors from the transverse plane onto the z-axis (90° plane rotations). Many imaging and spectroscopic pulse sequences require refocusing and 90° plane rotations.

As set forth below, the present invention provides a method for generating RF pulses that perform the sought after 90° and 180° planar rotations even when $B_1$ fields are highly non-uniform. Accordingly, the present invention provides a means for using surface coils or coils of any other geometry that possess variations in their $B_1$ field profiles for successful imaging or spectroscopy applications. When used with more complex coils, these pulses will improve the coil performance by eliminating problems that arise due to the small but non-negligible inhomogeneities in the $B_1$ profile of these coils. In addition, the present invention also provides a method for modulating the amplitude and frequency of adiabatic pulses to control the homogeneity of the $B_1$ field.

SUMMARY OF THE INVENTION

According to one aspect of the invention there is provided a method for generating RF adiabatic pulses to accomplish plane rotations of magnetic spins under the influence of a spin aligning magnetic field.

DETAILED DESCRIPTION OF THE INVENTION

There is described herein two pulses that can accomplish a 90° or 180° plane rotation in the presence of large $B_1$ field inhomogeneities. These pulses are composed of two or more segments; for illustrative purposes we have based each segment on the sin/cos amplitude and frequency modulated adiabatic half-passage pulse described by Bendall and Pegg in their paper, which in turn can be viewed as a modification of the classical adiabatic half-passage method. Alternative modulation schemes such as sech/tanh scheme described in the above-noted Silver et al paper can also be used. In each case, a 90° plane rotation will be accomplished; however, the range of $B_1$ field inhomogeneity tolerated by the pulse and the duration of the pulse will depend strongly on the modulation scheme. Neither the sin/cos nor the sech/tanh constitute optimum modulation functions. A method for generating optimized modulation is described and is part of this patent application. For simplicity of illustrations, the descriptions are based on sin/cos modulation.

90° pulses: the simpler of the two 90° pulses, pulse BIR-1 ($B_1$ independent rotation) is used herein to illustrate the general principles involved and the motion induced in a single set of spins with Larmor frequency $\omega_0$. For the purposes of this discussion, we will assume $\omega_o$ to represent a clockwise rotation. This assumption only affects the signs of the vectors that appear in the figures but not the end result.

The amplitude and frequency modulation schemes for BIR-1 are given by the equations:

$B_1(t) = |2\pi A v \cos 2\pi v t|$ [X'] $\Delta\omega = 2\pi A \sin 2\pi v t (0 > t > T/2)$ $B_1(t) = |2\pi A v \cos 2\pi \sigma t|$ [y'] $\Delta\omega = -2\pi A \sin 2\pi v t$
$(T/2 > t > T)$ where $\Delta\omega$ is defined as $(|\omega_o| - \omega(t)|)$ with $\omega(t)$ designating the frequency of the pulses in rad/sec, v is a parameter that takes into account variations in $B_1$ magnitude through space, and $v$ is the modulations frequency; T and $v$ satisfy the equality $2\pi vT = \pi$. In particular, the parameter v describes the ratio of peak $B_1$ amplitude to the peak frequency modulation amplitude A. If $B_1$ varies with space, so does v in an identical manner. Thus, in an amplitude and frequency modulated pulse, the $B_1$ at any point in space is given by: $B_1(t,r) = 2\pi B_1^0(r)F_1(t)$ and $\Delta\omega = 2\pi F_2(t)$; wherein $\omega$ is equal to $B_1^0(r)/A$. [x'] and [y'] designate the axes along which $B_1$ is applied on the reference frame that rotates at the instantaneous frequency of the pulse; thus, halfway through the pulse there is $\pi/2$ phase shift. The parameter A and v are in units of Hz, and $B_1$ magnitude is expressed in radians/sec. In the reference frame rotating at the frequency $\omega_o$, the magnetic component of the rf field for BIR-1 pulse is depicted by the following expressions:

$$B_1(t) = |2\pi A v \cos vt| \exp\left[i \int_0^t (2\pi A \sin 2\pi v t') dt'\right]$$

$(0 < t < T/2)$ $$B_1(t) = |2\pi A v \cos vt| \exp\left[i\left(A/v - \int_{T/2}^t (2\pi A \sin v t') dt' + \pi/2\right)\right]$$

$(T/2 < t < T)$

The exponents of the exponential terms above are the phase of the $B_1$ vector in the transverse plane of this rotating frame; thus, in this reference frame, the pulse is cast in terms of amplitude and phase modulated expressions. Thus, the pulses can be executed as amplitude and phase modulated rf-trains as well as amplitude and frequency modulated rf-trains. It is easier to visualize them as frequency modulated experiments.

As previously mentioned, sin and cos functions are used because of their simplicity. In general, $\cos 2\pi vt$ and $\sin 2\pi vt$ can be any pair of functions $F_1(t)$ and $F_2(t)$ respectively where $F_1(t)$ is maximum at $t=0$ or $t=T$ and is zero or very small at $t=T/2$, and $F_2(t)$ is maximum at $t=T/2$ and is zero or very small at $t=0$ or $t=T$.

Figure 1:
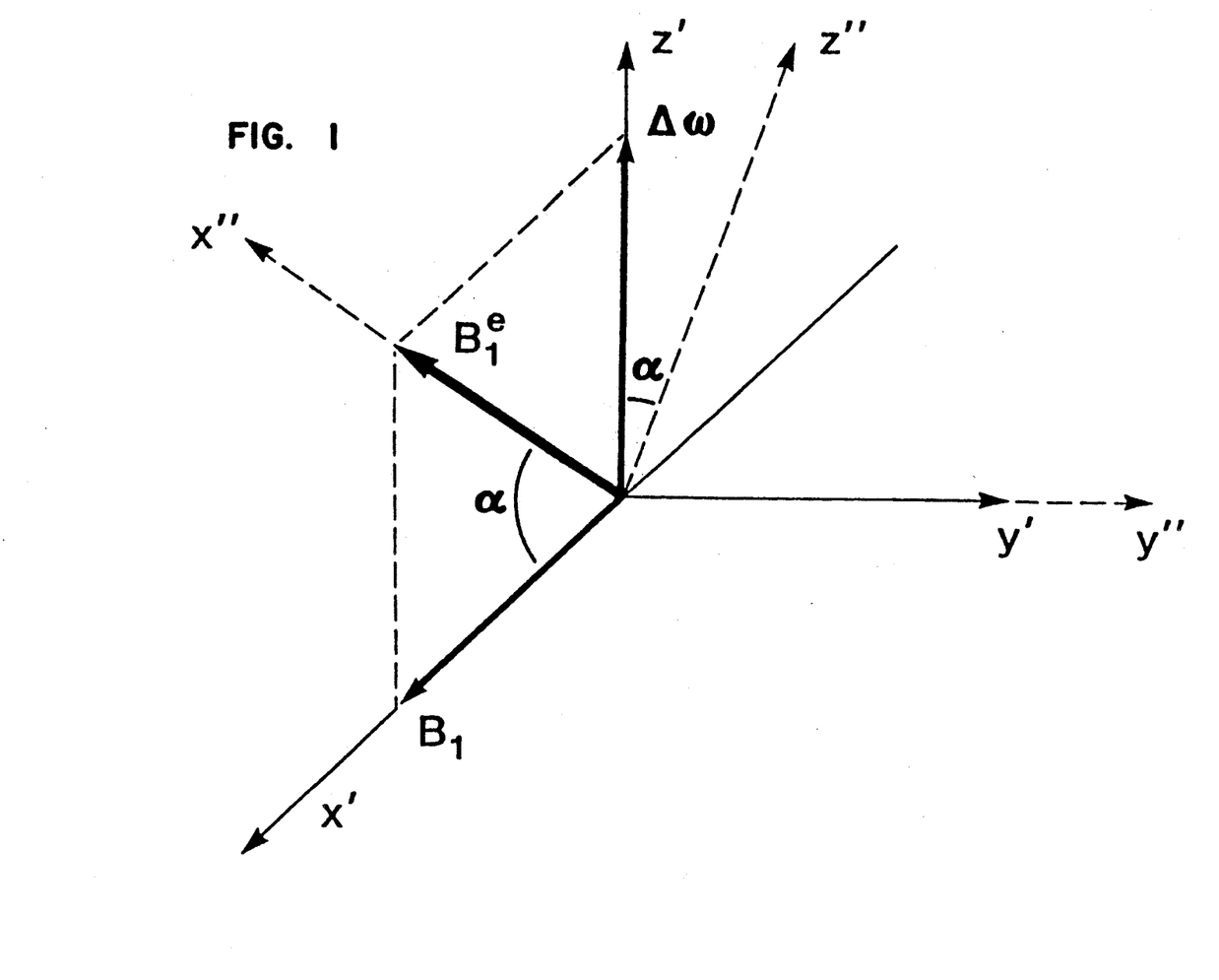
FIG. 1 shows the effective field ($B_{1e}$) in a rotating frame (defined by axes x', y', z') precessing at the pulse frequency (the axes x", y", z" define the second rotating frame where $B_1^e$ direction appears time-independent)
Figure 2A:
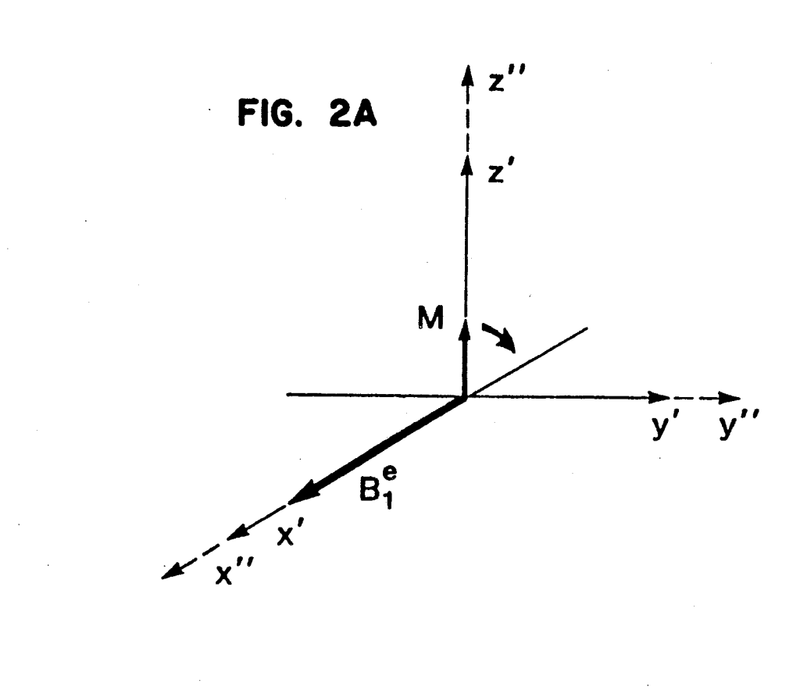
FIGS. 2A, 2B, 2C and 2D show $B_1^e$ and the motion of a magnetization vector initially along the z'-axis during BIR-1.
Figure 2B:
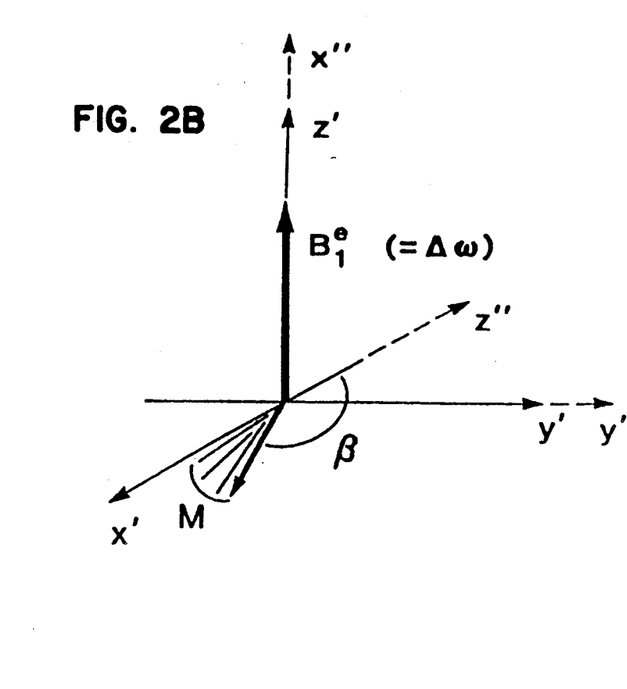
Figure 2C:
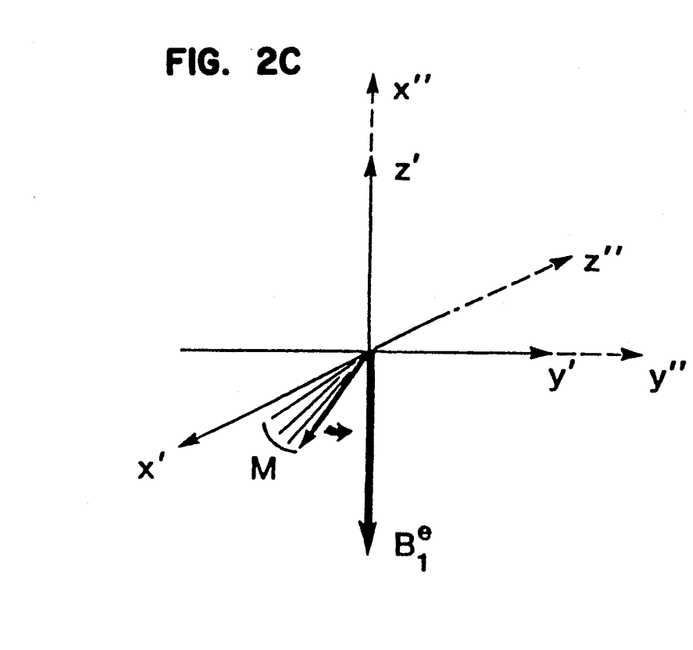
Figure 2D:
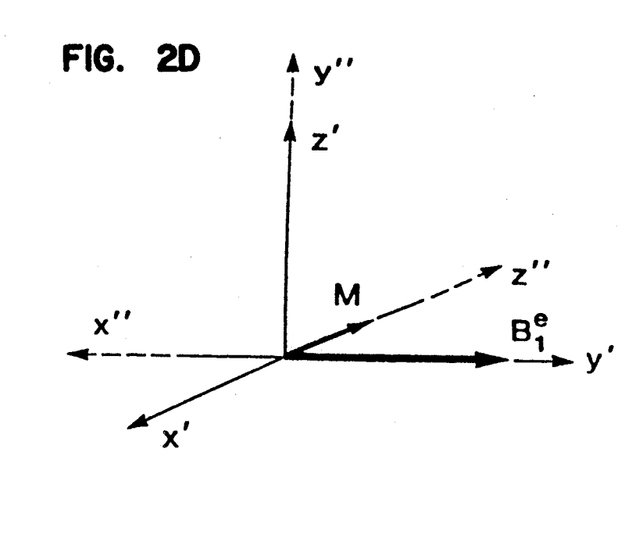

The motion induced by this pulse on magnetization vectors is visualized best in the reference frame that rotates at the instantaneous frequency of the pulse (which we described by use of the axes x', y', and z'). In this reference frame, the $B_1$ vector does not precess on the transverse plane. However, when the frequency of the pulse deviates from $\omega_o$, the spins encounter an additional magnetic field along the z'-axis of magnitude; $\Delta\omega$; therefore, the effective field in this reference frame, $B_{1e}$, becomes $(B_1^2 + \Delta\omega^2)^{\frac{1}{2}}$. FIG. 1 shows the effective field ($B_1^e$) in the rotating frame (defined by axes x', y', z') precessing at the pulse frequency. The axes x", y", z" define the second rotating frame where $B_1^e$ direction appears time-independent.

The motion of spins in the presence of this pulse can be divided into two distinct categories applicable to components that are collinear with or perpendicular to $B_{1e}$ at $t=0$. Both types of motion can be described with ease in a second rotating frame defined by unit vectors x", y" and z" (FIG. 1) where $B_1^e$ direction (but not necessarily its magnitude) remains constant. This reference frame will be referred to as the "second rotating frame" or the "$B_1^e$ frame." In this second rotating frame, there is an additional contribution to the effective magnetic field along the y" axis of magnitude $(d\alpha/dt)$; consequently, the effective field in this reference frame becomes the vector sum of $B_1^e$ and $(d\alpha/dt)$ [y"] and its magnitude is $((B_1^e)^2 - (d\alpha/dt)^2)^{\frac{1}{2}}$. Examination of the problem in this second rotating frame illustrated that the motion of a magnetization vector that is initially collinear with $B_{1e}$ will be a simple precession about the effective field in the second rotating frame. Consequently, the magnetization vector will remain at all times within an angle $2\alpha'$ of $B_{1e}$, where $\alpha'=\arctan(-$ $(d\alpha/dt)/B_1^e)$. Provided that $d\Delta/dt << B_1^e$, this magnetization vector will remain approximately collinear with $B_1^e$ and will change its orientation as the $B_1^e$ direction is altered with time. This is the classical adiabatic passage experiment. It should be noted that whether the magnetization vector is parallel or antiparallel to $B_1^e$ does not affect this description. In the case of BIR-1, a magnetization vector that is initially aligned along the x'-axis will be collinear with $B_1^e$, and will follow it to be aligned along the z' axis at T/2 and along the $-y'$-axis at T provided $d\alpha/dt << B_1^e$ is fulfilled. FIG. 2 shows $B_1^e$ and the motion of a magnetization vector initially along the z'-axis during BIR-1 at time points $t=0$ (a), T/2 (b), immediately after T/2 (c), and at T which is the end of this pulse (d). M executes a rotation of angle $\beta$ away from z" of the second rotating frame and at $t=t/2$ is fanned out on the x'y' plane which is coplanar with the z"y" plane of the second rotating frame; the fanning out is due to the variation in $B_1$ field magnitude in space. During the second half, M refocuses along z" which at this point is collinear with $-x'$.

The motion of the magnetization vectors which are intially perpendicular to $B_{1e}$ at $t=0$ (i.e., $M_{z'}$ and $M_{y'}$ for BIR-1) is also a simple precession in the x", y", z" frame about the effective field encountered in this frame. However, if the $d/dt << B_1^e$ condition is fulfilled, the effective field in this second rotating frame is approximately equal to $B_1^e$. Thus, in this limit, magnetization vectors initially along z' and y' (which at time zero are collinear with z" and y") will remain in the plane perpendicular to $B_1^e$ (i.e., z" y" plane) and rotate aboout $B_1^e$ angle $\beta$. At $t=T/2$, $\beta$ is equal to $$\int_o^{T/2} B_1^e(t) dt,$$

and will depend on the location of the spins due to the $B_1$ field inhomogeneities. Therefore, when $t=T/2$, magnetization vectors initially along z' or y' will be fanned out on the z"y" plane which at T/2 is coplanar with the x' y' plane (FIG. 2). At this point, the direction of $B_1^e$ is inverted by changing the sign of $\Delta\omega$ (FIG. 2) and $B_1^e$ remains along $-x"$ for the remainder of the pulse; since the modulation scheme is symmetric, $\beta$ for the complete pulse is zero. Consequently, the vectors that were fanned out on the z"y"-plane during the first half of the pulse are refocused along the same axes of the second rotating frame defined by the (x", y", z") axes has undergone a transformation relative to the (x', y', z') axes. Therefore, magnetization vectors initially along z' and y' have been rotated onto $-x'$ and z' axes, respectively (FIG. 2).

The principle introduction by this pulse is the following: The transformations induced by the pulse on magnetization vectors are simply the transformations of the second rotating frame (x", y", z") relative to the rotating frame of the rf pulse; this is accomplished by use of a "flip" in the direction of $B_1^e$ in the middle of the pulse so that $\beta$ is equal but of opposite signs in the two halves. At $t=0$, the rotating frames (x', y', z') and (x", y", z") are superimposable. The second rotating frame subsequently undergoes transformations in space as it follows the $B_1^e$ vector. All magnetization vectors intially along x", y", and z" execute a complex motion in space and are realigned along x", y", and z", respectively. An additional new feature introduced by this pulse is the use of discontinuous phase shifts in order to achieve the desired transformation. In this particular case, a $\pi/2$ phase shift is executed in the middle of the pulse. The overall transformation induced by BIR-1 is a 90° rotation of the x'z'-plane plus 90° phase shift which can also be viewed as a rotation about the x'-axis on the transverse plane, followed by a rotation about the z'-axis. The pulse induces this transformation at all values of $v$ where $d\alpha/dt < < B_1^e$ is satisfied. It should be noted that without the $\pi/2$ phase shift that is executed at T/2, BIR-1 becomes a refocusing pulse, i.e. a 180° plane rotation about the y'-axis.

Figure 3A:
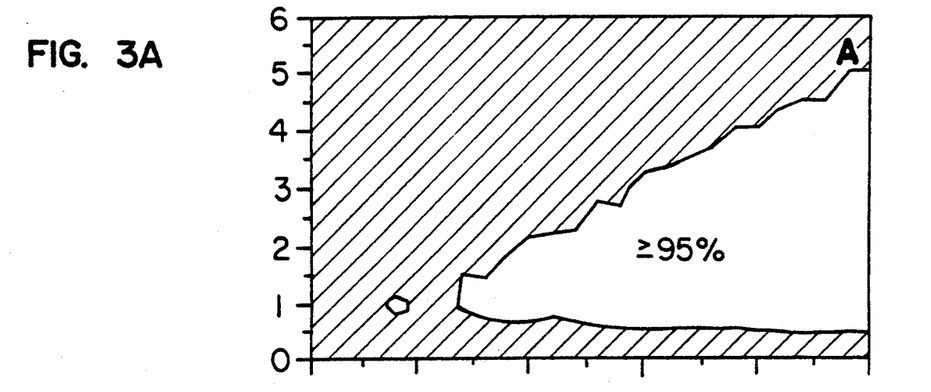
FIGS. 3A, 3B and 3C show a 95 percent contour line in the R and V space for the three transformations induced by pulse BIR-1.
Figure 3B:
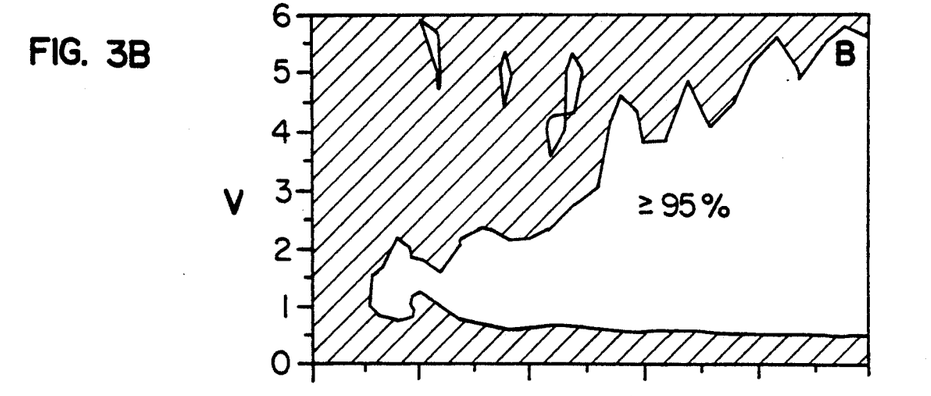
Figure 3C:
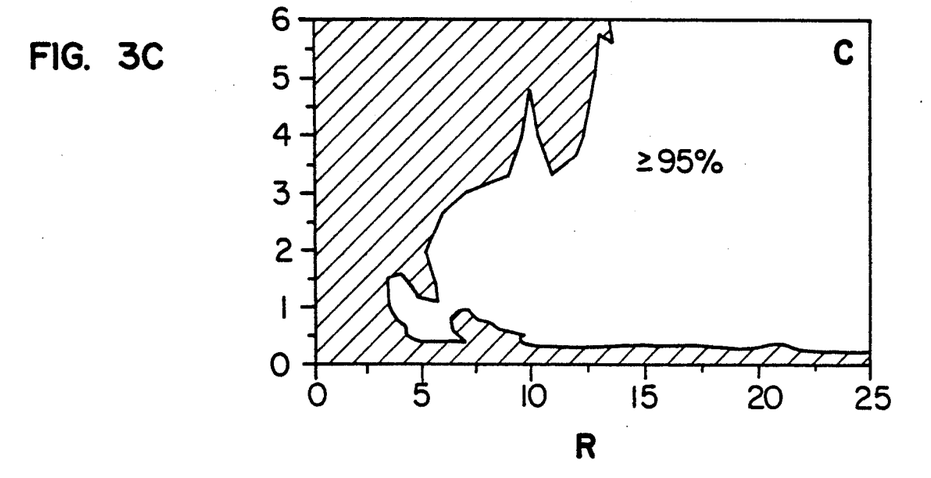

The range of $B_1$ inhomogeneity over which the desired rotation is achieved by this pulse calculated using Bloch equations is illustrated as contour plots as a function of $v$ and R (FIG. 3) where R is defined as A/v. Note that for $v=1$, R is equal to $B_1^e(d\alpha/dt)^{-1}$. At a given value of R, there is a range of v values over which the pulse works. The outer limits of this v range is defined by the two points at which a vertical line drawn at the specified R value intersects the contours. FIG. 3 shows the 95 percent contour line in the R and v space for the three transformations induced by pulse BIR-1: A) $M_x \to M_{-y}$ B) $M_y \to M_z$ C) $M_z \to M_{-x}$. For the calculations, sixth-order Runge-Kutta numerical methods were used to solve the Bloch equations as a function of R and v (grid size=24×18 points for each transformation). The calculations were performed with 2500 numerical steps per 90° sweep of $B_1^e$. The shaded area is the region where the pulse fails to work at 95 percent efficiency (i.e., the intensity of the vector subsequent to transformation is less than 95 percent of its original value). At all values of R and v that fall in the unshaded area, transformation preserves $\geq$ 95 percent of the original magnitude.

Figure 4A:
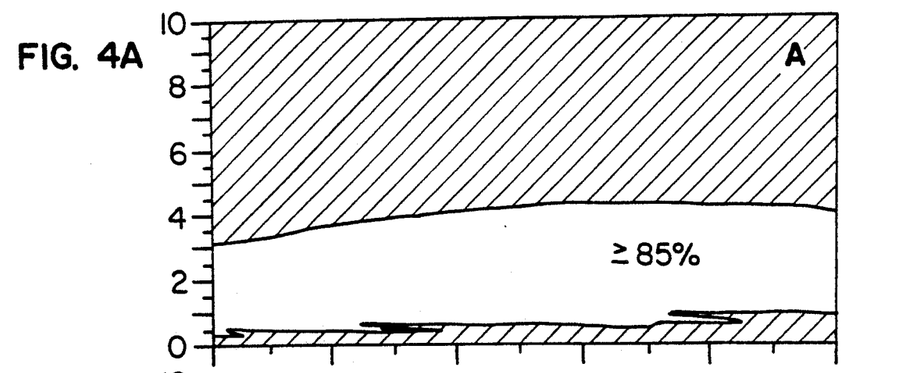
FIGS. 4A, 4B and 4C show shows off-resonance effect on BIR-2.
Figure 4B:
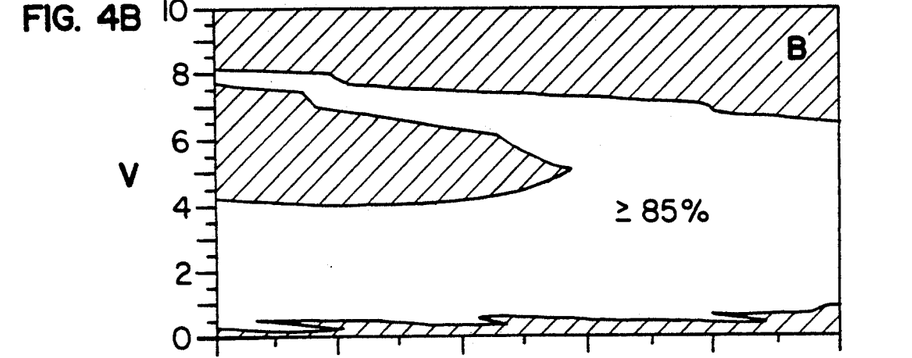
Figure 4C:
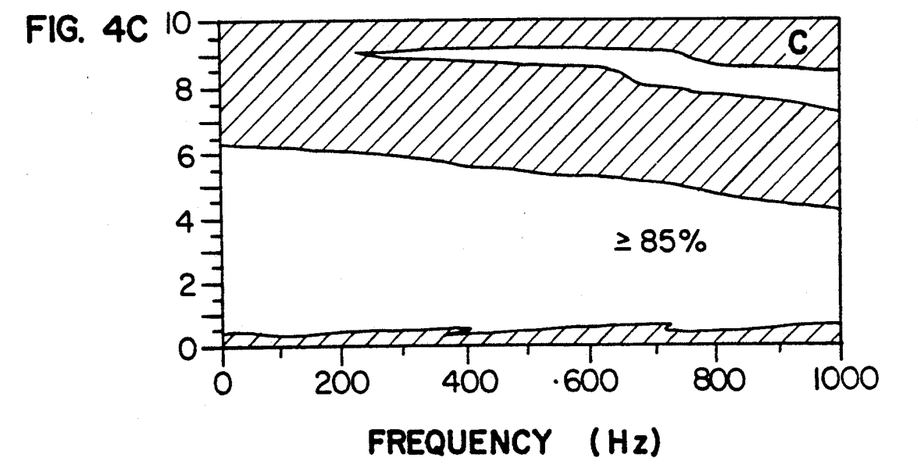

BIR-1 is extremely sensitive to off-resonance effects. For this pulse, the off-resonance condition exists if the frequency of the pulse at t=0 is not equal to the Larmor frequency of spin(s). In this case, $\Delta\omega$ becomes $2\pi A(s+\sin 2\pi vt)$ and $2\pi A(s-\sin 2\pi vt)$ for the first and second halves of the pulse, respectively, where As is the frequency offset in Hz. In consequence, $|\beta|$ for the two halves is unequal. This problem can be avoided if $\Delta\omega$ is always positive or always negative throughout the pulse. This condition is attained by pulse BIR-2 which is based on the same principal as BIR-1 but by necessity has a more complicated modulation scheme:

$B_1 = |2\pi A \cos 2\pi vt| \ [x'] \ 0 < t < T/2$ $B_1 = |2\pi A \cos 2\pi vt| \ [y'] \ T/2 < t < T$ $B_1 = |2\pi A \cos 2\pi vt| \ [-y'] \ T < t < 2T$ and $\Delta\omega = |2\pi A \sin 2\pi vt| \ 0 < t < 2T$ As before, $2\pi vT = \pi$; with this convention, however, the pulse duration of BIR-2 is 2T. For this pulse, $B_1^e$ is aligned along x' at t=0, and rotates on the x'z' plane to be aligned along z' at T/2. At this point, there is a $\pi/2$ phase shift and $B_{1e}$ rotates on the z'y' plane to be aligned along y' at T. Subsequently, its direction is altered to $-y'$. During the second half, $B_1^e$ only rotates on the y'z'-plane; it is aligned with z' at 3T/2 and $-y'$ at 2T. The second half of this only serves to refocus the magnetization vectors along appropriate axes; the desired transformation of the (x'', y'', z'') axes is achieved in the first half of the pulse FIG. 4 shows the frequency offset effect on the 85 percent contour level for BIR-2 at R=20 and A=5,000 Hz. The 85 percent contour level is plotted as a function tion of frequency offset and v at R=20, and A=5000 $H_2$ for the three transformations A) $M_x \to M_{-y}$, B) $M_y \to M_z$ and C) $M_z \to M_{-x}$. The shaded area is where transformation preserves less than 85 percent of the original intensity. Calculated grid size=21 by 22 points for each transformation.

Figure 5A:
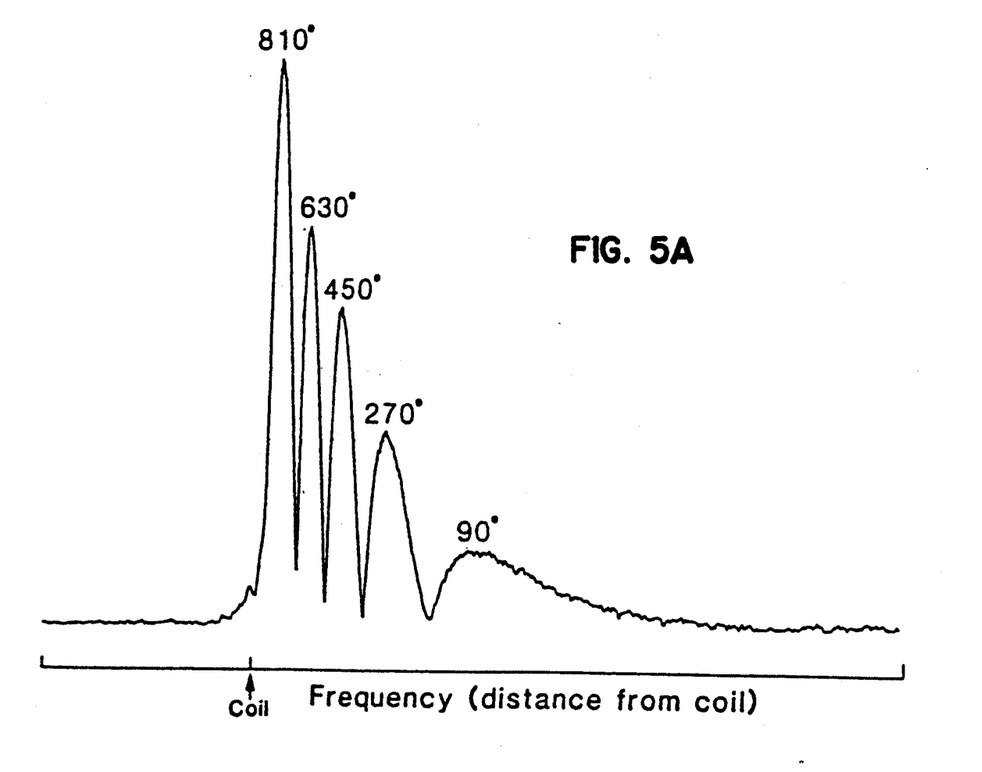
FIGS. 5A and 5B show signal intensity detected by a surface coil from an axial sample as a function of distance from the coil using a simple 270 us square pulse (FIG. 5A) and BIR-1 (FIG. 5B)
Figure 5B:
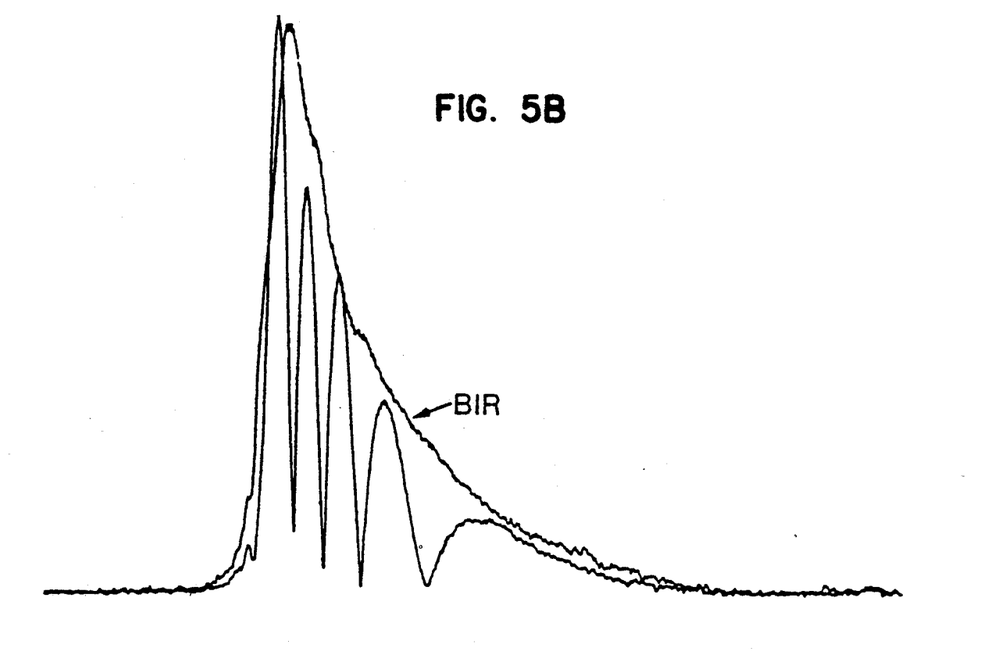
Figure 6:
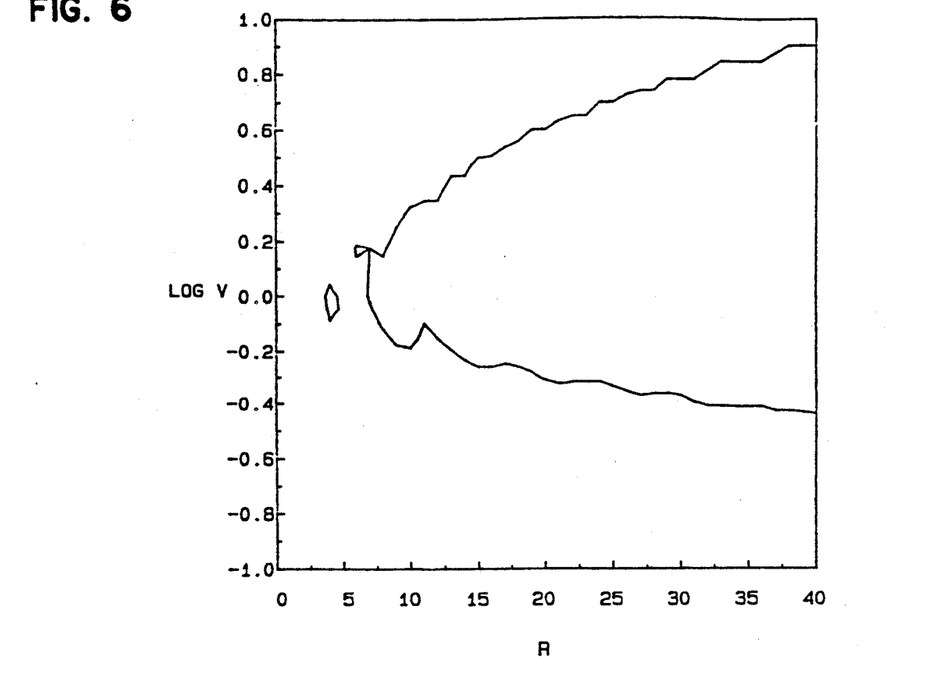
FIG. 6 shows a 95 % contour line in the R and V space for the refocusing component of the refocusing sin/cos modulation; and focusing pulse BIREF-1/ using sin/cos modulation.

FIG. 5 illustrates experimental data that demonstrates the insensitivity of BIR pulses to $B_1$ inhomogeneities. The data was obtained at 200 MHz, using a Varian VSI spectrometer. The frequency modulation scheme was achieved through modulation of the phase of the rf pulse. The experimental arrangement was a surface coil ($\sim$3 cm diameter) with a water filled 5 mm tube placed axially on one side of the coil plane. The magnetization was excited by use of either a standard square pulse or the BIR-1 pulse. The signal was detected in the presence of a read-out gradient directed along the coil axis. With this protocol, the Fourier transformed spectrum is a plot of the signal intensity vs. the distance from the surface coil; the distance is encoded as frequency. With a simple square pulse, the expected behavior is an oscillating signal whose intensity diminishes with increasing separation from the coil (FIG. 5a); the number of oscillations depends on the length of the pulse. With the square pulse used, several maxima were observed corresponding to 90°, 270°, 450°, 630° and 810° rotations. Because only the magnitudes are plotted, regions experiencing these rotations appear as positive. FIG. 5b shows data recorded with a 4 msec long BIR-1 pulse, corresponding to R=20, A=2500 Hz and $v$=125 Hz; the data recorded with the square pulse is reproduced in FIG. 5b for direct comparison. If the sample experiences a uniform 90° rotation of the $M_z$ magnetization vector irrespective of the $B_1$ magnitude, the signal detected should have a maximum near the coil and should decrease monotonically with increasing distance from the coil without any peaks and valleys. The decrease represents the decline in the coil sensitivity with distance A spectrum generated with a $B_1$-insensitive 90° rotation should approximately follow a tracing that is obtained by connecting all the maxima of the square pulse spectrum. It should be noted that this experiment measures that $M_z' \to M_x'$ transformation which takes place on the plane perpendicular to $B_1^e$ and relies on the refocusing achieved by the "flip" in the $B_1^e$ direction half-way through the pulse. This is the transformation that is new and unique to the present invention is different from simple adiabatic passage pulses.

180° PLANE ROTATION PULSES

A 180° plane rotation of magnetization vectors is required to achieve refocusing of dephased magnetization vectors in spin-echo experiments. Even though the 180° plane rotation pulses achieve spin-inversion as well as the transformation required for refocusing, it is their refocusing properties that are unique. Therefore, we refer to them as $B_1$ independent refocusing (BIREF) pulses.

The simplest BIREF pulse is BIR-1 without the $\pi/2$ phase shift in the middle of the pulse. In all the other adiabatic plane rotation pulses, this pulse also relies on the $B_1^e$-flip halfway through the pulse, and as in BIR-1;$B_1^e$ is equal to $\Delta\omega$ when $B_1^e$-flip is executed. This simply means that the phase of the $B_1$ in the spin frame is increasing with time at $t<T/2$ and decreasing with time for $t>T/2$.

In the numbering scheme used herein this pulse is called BIREF-2. Just like BIR-2, this pulse is sensitive to off-resonance effects It is also possible to construct a refocusing pulse by letting $B_1{}^e = \Delta\omega$; at the beginning and the end of the pulse and executing $B_1{}^e$ flip by a $\pi$ phase shift of $B_1$ when $B_1{}^e = B_1$ at in the middle of the pulse. Herein, this pulse is referred to as BIREF-1. Again using sin/cos functions for illustration, the magnetic fields experienced by spins in the frequency frame in the presence of sin/cos based BIREF-1 is given by the equations:

$$B_1(t) = 2\pi A\nu\sin 2\pi\nu t)\ [x']\ (0<t<T/2)$$

$$B_1 = (t) = -2\pi A\nu(\sin 2\pi\nu)\ [x']\ (T/2<t<t)$$

$$\Delta\omega(t) = 2\pi A(|\cos 2\pi\nu t| + s)\ (0<t<T)$$

In all cases, $B_1$ will be taken to be along with the $x'$ axis of the frequency frame at the onset of the pulse. The negative $B_1$ amplitude during the second half of the pulse simply means that a $\pi$ phase shift has been executed at $t=T/2$.

In these equations, there is included the parameter s to account for off-resonance. The off-resonance condition exists if at $t=T/2$ (when (cos $2\pi\nu t$) is 0) the frequency of the pulse is not equal to the frequency of the spins. The magnitude of the offset is expressed in terms of A using the dimensionless parameter s.

In the spin frame, BIREF-1 is depicted by the expression:

$$B_1(t) = (2\pi A\sin 2\pi\nu t)\exp\left[i\int_o^t 2\pi A(|\cos 2\pi\nu t'| + s)dt'\right]$$
$(0 < t < T/2)$ $$B_1(t) =$$
$$(2\pi A\sin 2\pi\nu t)\exp\left[i\left(\int_o^t 2\pi A(|\cos 2\pi\nu t'| + s)dt' + \pi\right)\right]$$
$(T/2 < t < T)$ The integrals that appear as the exponents of the exponentials is the phase of the $B_1$ in the spin frame.

The same principles described for the 90° pulses apply here and the other refocusing pulses. For BIREF-1 a magnetization vector, mz', is parallel to $B_1{}^e$ at $t=0$. In the second rotating frame, it remains along this axis and parallel to $B_1{}^e$ during the first half of the pulse. At $t=T/2$ direction of $B_1{}^e$ and consequently that of $B_1{}^e$ is inverted because of the $\pi$ phase shift. This is the $B_1{}^e$-FLIP. mz' becomes antiparallel to $B_1{}^e$ and remains so for the rest of the pulse. Thus at all times, mz' remains along the z''-axis of the second rotating frame. In the frequency frame, this translates into a rotation from $+z'$ to $-z'$ axis, i.e., an inversion. For a vector that is initially orthogonal to $B_1{}^e$, e.g., $m_x'$ (which at $t=0$ is along the $x''$ as well), the motion in the $B_1{}^e$-frame is a rotation about $B_1{}^e$ through an angle $\beta_1$ in the first half of the pulse. At $t=T/2$, $B_1{}^e$ direction is inverted; consequently, during the second half of the pulse the vector rotates in the opposite direction through an angle $\beta_2$.

For BIREF-1, $\beta_1$ is explicitly given by the equation:

$$|\beta_1| = R\int_o^{T/2} ((V^2\sin^2\theta)' = (|\cos\theta| + 2\pi As)^2)^{\frac{1}{2}}d\theta$$

where $\theta = 2\pi\nu t$ and R is a dimensionless constant defined as $A/\nu$ as before. This equation is valid for non-vanishing s. Similarly, $|\beta_2|$ is given by the same expression but the integral is performed from $\theta = \pi/2$ to $\theta = \pi$. Given the properties of sin and cos functions, $(\beta_1 + \beta_2)$ is zero for all values of $\nu$ and s even though both $\beta_1$ and $\beta_2$ depend on $\nu$ and s. Functions other than sin and cos must have the property that $(\beta_1 + \beta_2)$ is zero; in other words if $F_1$ and $F_2$ are general functions used instead of sin and cos, $|F_1(t)| = |F_1(t+T/2)|$ and $|F_2(t)| = |F_2(t+T/2)|$.

Thus, on resonance, in the $B_1{}^e$-frame, $m_x'$ starts out along $x''$ and precesses on the $x''y''$ plane, first clockwise about the $z''$ axis then counterclockwise, and is realigned along $x''$ at the end of the pulse irrespective of $\nu$. The same is true for a vector that is collinear with the $y''$ and $y'$ axes at $t=0$.

Overall, as in BIR pulses, the transformation induced by this pulse on magnetization vectors is simply the transformation of the second rotating frame. Vectors that are collinear with $x''$, $y''$ and $z''$ axes at the onset of the pulse are realigned along the same axes of the $B_1{}^e$-frame at the end of the pulse. However, this reference frame undergoes a 180° plane rotation about the $x'$-axis. Thus, $(m_x', m_y', m_z') \rightarrow (-m_x', m_y', -m_z')$ transformation is executed. These are 180° plane rotations about $x'$ and $y'$ axis respectively. These transformations are achieved irrespective of $\nu$ provided that $|d\alpha/dt| << B_1{}^e$ is satisfied.

The third pulse is designed to convert the adiabatic inversion pulse previously described by Silver and Holt (see MS Silver R. I., and D. I. Holt. J. Mag. Reson. 59, 347 (1984) into a pulse that can execute a 180° plane rotation and hence be useful in inversion as well as in refocusing applications. This pulse is referred herein as BIREF-3. This pulse is a good example of how one can impart the appropriate transformations to magnetization vectors that are orthogonal to $B_1{}^e$ by inverting $B_1{}^e$ half-way through the pulse and realigning them along the axes of the second rotating frame with which they were aligned initially.

The inversion pulse was first described by the equation $B_1(t) = \eta(\mathrm{sech}(\beta t))^{1+i\mu}$. In the terminology used herein, this equation describes $B_1(t)$ in the spin-frame. This pulse is equivalent to an amplitude and frequency modulated pulse given by the equations:

$$B_1(t) = \eta\mathrm{sech}(\beta t)\quad \Delta\omega(t) = \mu\beta(\tanh(\beta t) + s)\ (0<t<T)$$

where the s has been added to account for the offresonance condition (which exists if the frequency of the pulse at $t=T/2$ does not equal to the frequency of the spins) $\mu\beta$ has units of rad/s. For the sin/cos version of this inversion pulse, using the present nomenclature, the corresponding equations are:

$$B_1(t) = 2\pi A\nu(\sin 2\pi\nu t)\ [x'];\ \Delta\omega(t) = 2\pi(A\cos 2\pi\nu t)$$
$(0 < t < T)$ Both sech/tanh and sin/cos pulses achieve the same rotation of the $B_1^e$ in the frequency frame; $B_1^e$ is along z'-axis at t=0, collinear with a magnetization vector along the z'-axis. This magnetization vector will remain within an angle $2\alpha'$ ($\alpha' = \arctan((d\alpha/dt)/B_1^e)$) of $B_1^e$ as it precesses in the second rotating frame during the pulse. Therefore, provided $|d\alpha/dt| << B_1^e$, it will remain nearly collinear with $B_1^e$ and will be inverted if $|s|<1$. Because of this dependence on s, this pulse is a slice-selective inversion pulse.

During the inversion pulse, magnetization vectors initially perpendicular to $B_1^e$ (i.e., $m_x'$ and $m_y'$) will rotate about $B_1^e$ on the plane orthogonal to $B_1^e$ i.e., the x"y" plane); this plane is coplanar with the x'y'-plane at the onset and at the end of the pulse. Therefore at the end of the pulse, $m_x'$ and $m_y'$ will still be on the x'y' plane, having rotated an angle $\beta$ away from x" and y" axes respectively; $\beta$ will depend on v and R as before, and is given by the integral $$\int_0^T B_1^e(t')dt'.$$

In order to convert the inversion pulse into a 180°-plane rotation pulse, we would like to retain the $m_z' \rightarrow -m_z'$ transformation and realign $m_x'$ and $m_y'$ to be along the x' and negative y' axes, respectively. This we can do by adding onto the inversion pulse a new sequence. For the sin/cos inversion pulse this new sequence is given by the equations:

$$B_1(t) = 2\pi A v |\sin 2\pi v t| \; [x']; \; \Delta\omega(t) = 2\pi v t| + s)$$
$$(T<t<2T)$$

where $vT=1$. Here 2T is to be the length of the total pulse; the length of the simple inversion sequence is T. Thus, at the end of the inversion pulse, $B_1^e$, S direction is inverted ($B_1^e$-FLIP) to be aligned parallel to z'-axis it then rotates to be aligned with x'-axis o (at t=3/2T) (when s=0) and rotates back to be parallel with the z'-axis once again at 2T. Thus, the new sequence added onto the inversion pulse does nothing to vectors along the z' axis; however, if s=0, this sequence rotates $m_x'$ and $m_y'$ back to x" and y" which at t=T and 2T correspond to x' and -y' axes of the frequency frame.

On resonance, $|\beta_2|$ the rotation achieved in the x"y" plane as t progresses from T to 2T for magnetization vectors orthogonal to $B_1^e$ is equal to $|\beta_1|$; consequently, appropriate "refocusing" along the axes of the $B_1^e$-frame is achieved by the $B_1^e$ inversion. However, when s is not zero in this pulse as in BIREF-2 $|\beta_1| \neq |\beta_2|$. This is because when $s \neq 0$, $\Delta\omega$ is negative for T<t<2T whereas it is positive at all other times. Thus, the $\Delta\omega$ contribution to $\beta_1$ and $\beta_2$ are not the same when $s \neq 0$.

However, there is a major difference between this pulse and BIREF-2. Namely, the components involved in refocusing (i.e., magnetization vectors on the transverse plane, $m_x'$, $m_y'$) are both orthogonal to $B_1^e$. In BIREF-2, one is orthogonal to and the other collinear with $B_1^e$. Consequently, for BIREF-3 even though $|\beta_1| \neq |\beta_2|$ when $s \neq 0$, the angle between $m_x'$ and $m_y'$ is 90° at the beginning of the pulse and 270° at the end of the pulse. In defining the angle between $m_x'$ and $m_y'$, the convention of measuring positive angles going counter clockwise from x'-axis is used. Thus, if s =0, the pulse executes the transformation $m_x' \rightarrow m_x'$, $m_y' \rightarrow m_y'$. If $S \neq 0$, $m_x' \rightarrow \overline{m}_x$ and $m_y' \rightarrow \overline{m}_y$ where $\overline{m}_x$ and $\overline{m}_y$ are no longer along x' and -y' axes. However, $\overline{m}_x$ and $\overline{m}_y'$ are orthogonal to each other with the angle between them being 270° whereas the angle between $m_x'$ and $m_y'$ was 90°. In essence, this means that BIREF-3 induces a resonance offset dependent phase shift on the refocusing components. Another way of expressing this is that the axis of the 180° plane rotation is the x' axis when s =0; when $s \neq 0$, rotation axis is shifted an angle $\phi$ (s) relative to the x'-axis, where $\phi(s) = |\beta_1(s)| - |\beta_2(s)|$.

OPTIMIZING THE MODULATION FUNCTIONS

In all the discussion above, there was used sin/cos modulation functions for illustrative purposes. These are not optimum modulations. All of these pulses, as well as any pulse based on adiabatic principles work provided $B_1^e >> |d\alpha/dt|$. An optimized function satisfies this condition over a desired range of $B_1$ inhomogeneity (i.e., v). Here there is described a method by which this can be done.

All the above-specified 90° and 180° plane rotation pulses as well as previously described adiabatic spin-excitation and inversion pulses are composed of segments during which the $B_1^e$ vector rotates 90 degrees. Because of the symmetries in these pulses, there is a need to consider one such segment. A 90° rotation of $B_1^e$ from the z'-axis on to the transverse plane will be considered. For such a segment, generalized equation for amplitude and frequency modulation are given by:

$$B_1(t) = 2\pi A v F_1(t) \quad \Delta\omega(t) = 2\pi A F_2(t)$$

where $F_1(t)$ and $F_2(t)$ are functions of time. $F_1$ and $F_2$ must be such that at t=0, $F_1=0$ and $F_2$ is at its maximum and at the end of the segment, $F_1$=maximum, $F_2$=0. There can be calculated from these equations $B_1^e(-d\alpha/dt)^{-1}$. Since, $\alpha = \arctan(\Delta\omega/B_1)$:

$$|B_1^e(-d\alpha/dt)^{-1}| = (B_1^2 + \Delta\omega)^{3/2}(B_1(d\Delta\omega/dt) - \Delta\omega(dB_1/dt))^{-1}|$$

or, in terms of $F_1(t)$ and $F_2(t)$ $$|B_1^e(d\alpha/dt)^{-1}| = |A2\pi v^{-1}(v^2F_1^2 + F_2^2)^{3/2}(F_1\dot{F}_2 - F_2\dot{F}_1)|$$

where $\dot{F}_1$ and $\dot{F}_2$ are functions of time and $\dot{F}_i$ represents the time derivative of function $F_i$.

For a given v value, it is not difficult to choose an optimum function for $F_1$ and $F_2$. For $v=1$, in fact sin/cos functions represent the optimum modulation as will be shown.

How can there be chosen an optimum modulation over a range of v's? One approach is the following: choose functions $F_1$ and $F_2$ and drive them not with the parameter t but a parameter that is itself a function of t. Thus, $$B_1(t) = 2\pi A v F_1(n(t)) \text{ and } \Delta\omega = 2\pi A F2(n(t))$$

Now, $$|B_1^e(d\alpha/dt)^{-1}| = 2\pi Av^{-1}|(v^2F_1^2 + F_2^2)^{3/2}(F_1\dot{F}_2 - F_2\dot{F}_1)^{-1}(\dot{n}(t))^{-1}|$$

If a specific choice is made for $F_1$ and $F_2$, then one can calculate what $\eta(t)$ must be so that $B_{1e}(d\alpha/dt)^{-1} >> 1$ at all time points for the desired $v$ range.

This is first illustrated for a single $v$ value. $F_1$ and $F_2$ are chosen arbitrarily to be sin and cos functions so:

$$B_1(t) = 2\pi A \sin(\eta(t)) \quad \Delta\omega = 2\pi A \cos(\eta(t))$$

Given these functions, it can be shown that $$|B_1{}^e(d\alpha/dt)^{-1}| = 2\pi A v^{-1}(v^2\sin^2(\eta) + \cos^2(\eta))^{3/2}|(\dot\eta)^{-1}|$$

$\eta$ is a function that goes from 0 to $\eta/2$ in time, as t varies from 0 to $\tau$, where $\tau$ is the length of the segment we are considering. There can be defined a new function $\eta'$ which goes from 0 to 1 in unit time. Therefore, $\dot\eta = 2\pi\bar{v}\dot\eta'$ where $\bar{v}$ has units of Hertz. Note that $(\pi/2)\tau^{-1} = 2\pi\bar{v}$, where $\bar{v}$ is the average rate in sec$^{-1}$ at which $\eta(t)$ progresses from 0 to 1 and $B_1{}^e$ rotates by 90°. Defining $R$ to be $A/\bar{v}$:

$$|B_1{}^e(d\alpha/dt)^{-1}| = R\phi(t')$$

where $$\phi(t') = v^{-1}(v^2\sin^2(\eta) + \cos^2(\eta))^{3/2}|(\dot\eta')^{-1}|$$

and $t'$ is $t/\tau$. Now, for a given $v$, $\eta'(t)$ can be calculated so that $\phi(t) = 1$. In fact, for $v = 1$, $\eta' = t'$ and $\eta = 2\pi v t$. This is the proof of the earlier statement that sin/cos is the optimum modulation for $v = 1$.

Figure 7:
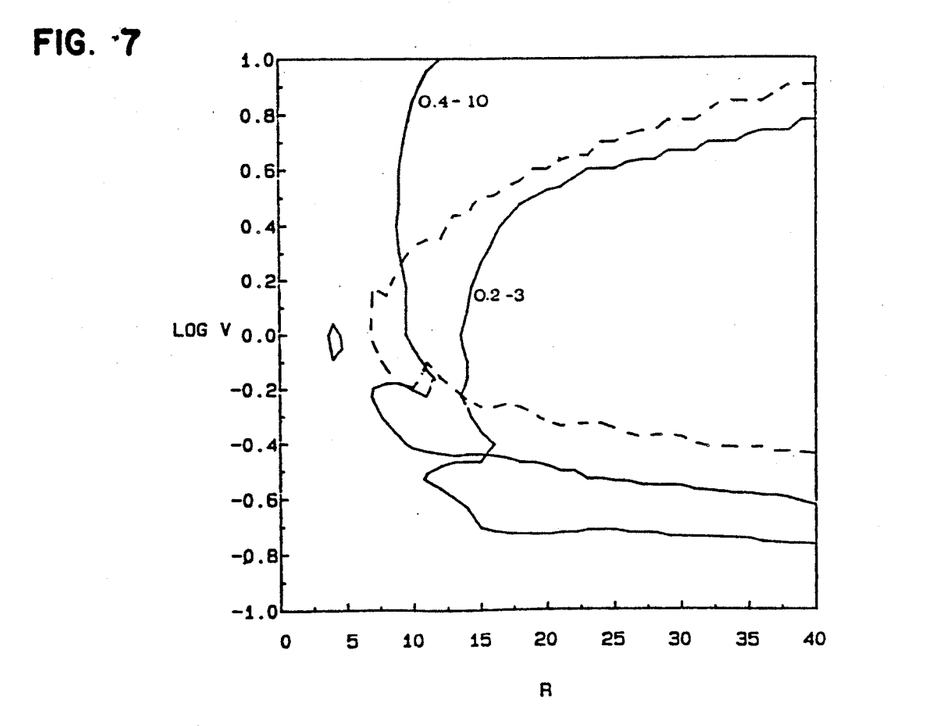
FIG. 7 shows the 95 % contour line in the R and V space for the refocusing component of BIREF-1 when the modulation functions were calculated numerically and optimized in the range V=0.2 to 3 and V=0.4 to 10.0. The dashed line is the contour for the sin/cos modulation.

How can one calculate a $\eta(t)$ so that, the pulse works over a range of $v$ values? The procedure is based on the fact that one must have $\phi(t') >>$ for all $v$ values of interest at all times This can be done numerically with ease. For each value of $t'$, there can be calculated a series of values for $\dot\eta$, each of which corresponds to a single $v$ value in the range of interest. To execute this numerically, the $t'$ and $v$ are divided into many discreet values (e.g., $\sim 1000$) and numerically calculate $\dot\eta$ at each $t'$ for all the discreet $v$ values From this set, one chooses the $\dot\eta$ value that corresponds to the minimum $\phi$. This process is repeated for the $t'$ range 0 to 1, obtaining a set $\dot\eta$ values for each discreet $t'$ value. Again numerically, from this set one can construct $\eta(t)$ by the process:

$$\eta_k' = \left(\sum_1^k \dot\eta_i' t_i'\right)/(\Sigma\dot\eta_i' t_i')$$

and where summation in the denominator is performed over all values of i. For this function $\eta'$, now sin $(\eta(t))$ and cos$(\eta(t))$ represent modulation functions that maintain the relationship $|B_{1e}(d\alpha/dt)^{-1}| \geq R$ in the $v$ range of interest. In this modulation scheme, once the pulse starts working, it works uniformly well over the $v$ range for which it was optimized. The gains attained by this mode is illustrated in FIG. 7 for BIREF-1. It should be noted that one can start with sech/tanh functions and arrive at the same final result.

The same procedure can be used for example to set $d\alpha/dt \leq 1$ for a specific $v$ range; in this case, $\eta'$ is calculated using the equality:

$$|v^{-1}(v^2F_1{}^2 + F_2{}^2)(F_1\dot F_2 - F_2\dot F_1)(\dot\eta')^{-1}| = 1$$

The above optimization methods are based on adjusting the rate at which $\alpha$ changes with time.

An alternative is to modulate the $B_1{}^e$ magnitude. If one takes the modulation functions in their most general sense to be:

$$B_1(t) = 2\pi v A(t)F_1(\eta(t)) \quad \Delta\omega = 2\pi A(t)F_2(\eta(t))$$

and take $A(t)$ to be a function of time, the expression $d\alpha/dt$ is not altered at all but by the time dependent variations in A. However, now one can modulate the $B_1{}^e$ magnitude separately to achieve the aliabatic condition $B_1{}^e|d\alpha/dt >> 1$. This follows from the fact that:

$$|B_1{}^e(d\alpha/dt)^{-1}| = (A(t')/\bar{v})|\phi(t')|$$

if $\phi(t')$ is already optimized, $A(t') =$ constant. Alternatively, $A(t')$ can be modulated to minimize off-resonance effects. One possible approach is to choose $\eta(t)$ so that $|d\alpha/dt| \leq 1$ in the $v$ range of interest and then calculate $A(t)$ so that $|B_1{}^e(d\alpha/dt)^{-1}| >> 1$ in the $v$ range of interest. Alternatively, the two different optimization procedures (one altering $d\alpha/dt$ the other $B_1{}^e$ magnitude) can be used for different purposes. For example, one can use $\eta(t)$ to optimize so that $|B_1{}^e (d\alpha/dt)^{-1}| >> 1$ on resonance, and then use $A(t)$ to optimize the pulse off-resonance.

Thus it will be seen that the present invention provides a method for performing 90° and 180° plane rotations using a surface coil. Furthermore, the present invention describes a method of second order modulation to achieve a uniform $B_1$ field strength throughout a substantial volume of space. Hence, the present invention makes it possible to use surface coils both for Bl field generation and signal detection, providing considerable potential for cost savings by substitution of the surface coil for whole body coils for many imaging and localized spectroscopy applications. The invention further affords relief from the technical difficulties in using the unwieldy whole body coils and the problems of decoupling. Furthermore, the present invention is even useful in enhancing rotating frame localization techniques, where spatial variations in the surface coil $B_1$ field are necessary to the technique.

Although the invention has been described herein in its preferred form, those skilled in the art will recognize that many variations and modifications may be made thereto without departing from the spirit and scope of the claims appended hereto.

We claim:

1. A method for executing a plane rotation of magnetic spins in matter under the influence of a spin aligning magnetic field $B_0$, said magnetic spins having a Larmor frequency $\omega_0$, said method comprising the steps of:
   (a) providing a coil responsive to electrical energization to generate a $B_1$ field;
   (b) orienting said coil so that the $B_1$ field generated by said coil has components transverse to said $B_0$ field;
   (c) energizing said coil to generate an RF adiabatic pulse providing said $B_1$ field, wherein with the frequency of said pulse deviates from $\omega_0$ said spins encounter an additional magnetic field $\Delta\omega$ to create said effective field $B_1{}^e$ desired as $(B_1{}^2 + \Delta\omega^2)^{\frac{1}{2}}$, said pulse generated to cause a flip in the effective field $B_1{}^e$ in said matter so that said magnetic spins undergo a plane rotation.

2. A method for executing a plane rotation of magnetic spins in matter under the influence of a spin aligning magnetic field $B_0$, said magnetic spins having a Larmor frequency $\omega_0$, said method comprising the steps of:

(a) providing a coil responsive to electrical energization to generate a $B_1$ field;

(b) orienting said coil so that the $B_1$ field generated by said coil has components transverse to said $B_0$ field;

(c) energizing said coil to generate an RF adiabatic pulse providing said $B_1$ field wherein when the frequency of said pulse deviates from $\omega_0$ said spins encounter an additional magnetic field of magnitude $\Delta\omega$ to create an effective field $B_1^e$ defined as $(B_1^2+\Delta\omega^2)^{\frac{1}{2}}$, said adiabatic pulse generated to cause said $B_1^e$ field to invert its direction, or flip, during the pulse so that said magnetic spins undergo a plane rotation.

3. The method according to claim 1 or 2 wherein the amplitude and frequency of said pulse is modulated to control the range in said matter over which said plane rotation is achieved.

4. The method of claim 3 wherein said amplitude and frequency of said pulse are described by independent time dependent functions $F_1(\eta(t))$ and $F_2(\eta(t))$ respectively, wherein the time argument $\eta(t)$ is a non-linear function of time.

5. A method for executing a plane rotation of magnetic spins in matter under the influence of a spin aligning magnetic field $B_0$, said magnetic spins having a Larmor frequency $\omega_0$, said method comprising the steps of:

(a) providing coil responsive to electrical energization to generate a $B_1$ field;

(b) orienting said coil so that the $B_1$ field generated by said coil has components transverse to said $B_0$ field; and (c) energizing said coil to generate an RF adiabatic pulse providing said $B_1$ field, wherein when the frequency of said pulse deviates from $\omega_0$, said spins encounter an additional magnetic field of magnitude $\Delta\omega$ to create an effective field $B_1^e$ defined as $(B_1^2+\Delta\omega^2)^{\frac{1}{2}}$, said pulse generated to include a substantially 180° phase shift in said $B_1$ field at a time when $B_1$ substantially equals said effective field $B_1^e$ to flip said effective field $B_1^e$ in said matter to cause said magnetic spins to undergo a plane rotation.

6. A method according to claim 5 wherein said $B_1$ is shifted in phase and said effective field $B_1^e$ is correspondingly flipped by changing the frequency of said pulse.

7. A method according to claim 5 wherein said $B_1$ is shifted in phase and said effective field $B_1^e$ correspondingly is flipped by changing the time derivative of the phase of said pulse.

8. A method according to claim 5 wherein the amplitude and frequency of said pulse are modulated to control the range in said matter over which said plane rotation is achieved.

9. A method according to claim 5 wherein the frequency of said pulse is modulated to control the range in said matter over which said plane rotation is achieved.

10. A method of claim 8 wherein the amplitude and frequency of said pulse are described by independent time dependent functions $F_1(\eta(t))$ and $F_2(\eta(t))$ respectively, and further wherein the argument $(\eta(t))$ is a non-linear function of time.

11. A method for executing a plane rotation of magnetic spins in matter under the influence of a spin aligning magnetic field $B_0$, said magnetic spins having a Larmor frequency $\omega_0$, said method comprising the steps of:

(a) providing a coil responsive to electrical energization to generate a $B_1$ field;

(b) orienting said coil so that the $B_1$ field generated by the said coil has components transverse to said $B_0$ field;

(c) energizing said coil to generate an RF adiabatic pulse providing said $B_1$ field wherein when the frequency of said pulse deviates from $\omega_0$ said spins encounter an additional magnetic field of magnitude $\Delta\omega$ to create an effective field $B_1^e$ defined $(B_1^2+\Delta\omega^2)^{\frac{1}{2}}$, said adiabatic pulse generated to cause said $\Delta\omega$ field to invert its direction at a time when $B_1^e$ substantially equals $\Delta\omega$ to cause said $B_1^e$ field to flip during said pulse to cause said magnetic spins to undergo a plane rotation.

12. A method according to claim 11 wherein said $\Delta\omega$ and effective field $B_1^e$ is inverted by changing the frequency of said pulse.

13. A method according to claim 11 wherein said $\Delta\omega$ and effective field $B_1^e$ is inverted by changing the sign of the time derivative of the plane of said pulse.

14. A method according to claim 11 wherein the amplitude and frequency of said pulse are modulated to control the range in said matter over which said plane rotation is achieved.

15. A method according to claim 11 wherein the frequency of said pulse is modulated to control the range in said matter over which said plane rotation is achieved.

16. A method of claim 14 wherein the amplitude and frequency of said pulse are described by independent time dependent functions $F_1(\eta(t))$ and $F_2(\eta(t))$ respectively, and further wherein the argument $(\eta(t))$ is a non-linear function of time.

17. A method for executing a plate rotation of magnetic spins in matter under the influence of a spin aligning magnetic field $B_0$, said method comprising the steps of:

(a) providing a coil responsive to electrical energization to generate a $B_1$ field;

(b) orienting said coil so that the $B_1$ field generated by said coil has components transverse to said $B_0$ field;

(c) energizing said coil to provide an RF adiabatic pulse providing said $B_1$ field, wherein when the frequency of said pulse deviates from $\omega_0$ said spins encounter an additional magnetic field of magnitude $\Delta\omega$ to create an effective field $B_1^e$ defined as $(B_1^2+\Delta\omega^2)^{\frac{1}{2}}$, said pulse generated to have at least two contiguous segments described by the equations:

Segment 1:
$$B_1(t) = 2\pi A \nu F_1(t)$$
$$\Delta\omega(t) = 2\pi A F_2(t) \quad (t_0 < t < t_1)$$

Segment 2:
$$B_1(t) = 2\pi A \nu F_1(t)$$
$$\Delta\omega(t) = 2\pi A F_2(t) \quad (t_1 < t < t_2)$$

wherein:
$F_1$ and $F_2(t)$ are functions of time;
$\Delta\omega$ is defined as $(|\omega_0| - |\omega(t)|)$ with $\omega_0$ designating the Larmor frequency of said set of magnetic spins and $\omega(t)$ designating the frequency of said adiabatic pulse; v is a parameter which takes into account variations in $B_1$ magnitude through space and is the ratio of peak $B_1$ amplitude to the peak frequency modulation amplitude A so that if $B_1$ changes in space so does v;

A is a parameter designating the maximum amplitude of the $B_1$ field;

$\Delta\omega(t)$ for segment 2 is a negative relative to $\Delta\omega(t)$ for segment 1 at time $t_1$ to provide for a flip in the $B_1^e$ direction at the time $t_1$;

$B_1^e = B_1$ at the beginning and end of said pulse and $B_1^e = \Delta\omega$ when said flip in the $B_1^e$ field is accomplished; and so that said pulse is generated to cause said magnetic spins to undergo a plane rotation.

18. A method for executing a plane rotation of magnetic spins in matter under the influence of spin aligning magnetic field $B_0$, said magnetic spins having a Larmor frequency $\omega_0$, said method comprising the steps of:

(a) providing a coil responsive to electrical energization to generate a $B_1$ field;

(b) orienting said coil so that the $B_1$ field generated by said coil has components transverse to said $B_0$ field;

(c) energizing said coil to provide an RF adiabatic pulse providing said $B_1$ field, wherein when the frequency of said pulse deviates from $\omega_0$ said spins encounter an additional magnetic field of magnitude $\Delta\omega$ to create an effective field $B_1^e$ defined as $(B_1^2 + \Delta\omega^2)^{\frac{1}{2}}$, said pulse having at least two contiguous segments described by the equations:

Segment 1:
$$B_1(t) = 2\pi A v F_1(t)$$
$$\Delta\omega(t) = 2\pi A F_2(t) \quad (t_0 < t < t_1)$$

Segment 2:
$$B_1(t) = 2\pi A v F_1(t)$$
$$\Delta\omega(t) = 2\pi A F_2(t) \quad (t_0 < t < t_1)$$

wherein:

$F_1(t)$ and $F_2(t)$ are functions of time;

$\Delta\omega$ is defined as $(|\omega_0| - |\omega(t)|)$ with $\omega_0$ designating the Larmor frequency of said set of magnetic spins and $\omega(t)$ designating the frequency of said adiabatic pulse; v is a parameter which takes into account variations in $B_1$ magnitude through space and is the ratio of peak $B_1$ amplitude to the peak frequency modulation amplitude A so that if $B_1$ changes in space so does v;

A is a parameter designating the maximum amplitude of the $B_1$ field;

$B_1^e = B_1$ at time $t_1$;

$B_1(t)$ for segment 2 is negative or in other words 180° out of phase relative to $B_1(t)$ for segment 1 at time $t_1$ to provide a flip in the $B_1^e$ direction at time $t_1$;

$B_1^e = \Delta\omega$ at the beginning and end of said pulse; and so that said pulse is generated to cause said magnetic spins to undergo a plane rotation.

19. A method according to claim 1 wherein said adiabatic pulse induces a well-defined rotation about a well-defined axis in a first rotating frame of reference, said first rotating frame of reference rotating at the instantaneous frequency of said pulse, and further wherein for all $B_1$ magnitudes through said matter the net $\beta$ is zero at the end of said pulse, wherein $\beta$ is the angle through which magnetization vectors in said matter rotate about $B_1^e$ in a second rotating frame of reference rotating with $B_1^e$ such that the axis along which $B_1^e$ is aligned is stationary in said second rotating frame of reference.

20. A method according to claim 2 wherein said adiabatic pulse induces a well-defined rotation about a well-defined axis in a first rotating frame of reference, said first rotating frame of reference rotating at the instantaneous frequency of said pulse, and further wherein for all $B_1$ magnitudes through said matter the net $\beta$ is zero at the end of said pulse, wherein $\beta$ is the angle through which magnetization vectors in said matter rotate about $B_1^e$ in a second rotating frame of reference rotating with $B_1^e$ such that the axis along which $B_1^e$ is aligned is stationary in said second rotating frame of reference.

* * * * *